July 1, 1969 R. F. GARDINER 3,453,532
METAL DETECTOR INCLUDING A HARTLEY OSCILLATOR WITH FIELD EFFECT TRANSISTOR AND DELAYED AUTOMATIC AMPLITUDE STABILIZING FEEDBACK
Original Filed June 10, 1966
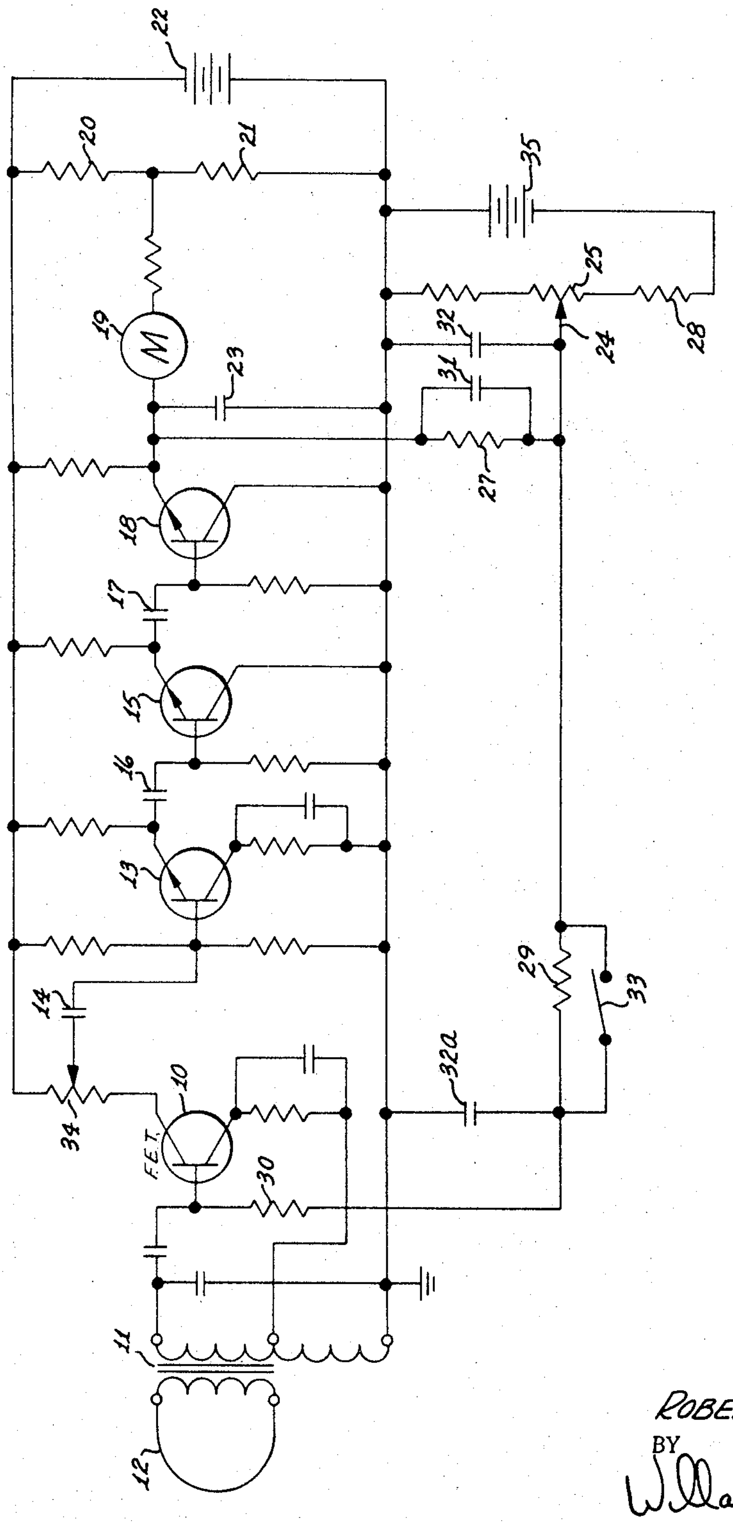
INVENTOR.
ROBERT F. GARDINER
BY
ATTORNEY

United States Patent Office 3,453,532

Patented July 1, 1969

3,453,532

METAL DETECTOR INCLUDING A HARTLEY OSCILLATOR WITH FIELD EFFECT TRANSISTOR AND DELAYED AUTOMATIC AMPLITUDE STABILIZING FEEDBACK

Robert F. Gardiner, 4729 N. 7th Ave., Phoenix, Ariz. 85013

Continuation of application Ser. No. 562,995, June 10, 1966. This application Sept. 6, 1967, Ser. No. 688,633
Int. Cl. G01v *3/12*
U.S. Cl. 324—3 1 Claim

ABSTRACT OF THE DISCLOSURE

A metal detector utilizing a Hartley oscillator having a field effect transistor therein. The output of the oscillator is connected through amplifying means to a meter and includes a negative feedback delayed through a RC network for automatic amplitude stabilization. The oscillator is a low Q oscillator susceptible to the detection of metal whereupon a further reduction in the Q of the circuit causes substantial reduction in the amplitude of oscillations.

This application is a continuation of co-pending application Ser. No. 562,995 filed June 10, 1966, now abandoned.

This invention pertains to improvements in metal detectors and more particularly to an improved circuit and operation for metal detectors.

One of the objects of this invention is to provide an efficient transistorized metal detector with very little ground pickup and great sensitivity with outstanding stability due to automatic tuning and simple push button tuning that can be used over land as well as salt water or fresh water.

Still another object is to provide a metal detector as above in which the amount of feedback is so great the whole circuit can be tuned when first turned on by only pressing a push button switch.

Further features and advantages of this invention will appear from a detailed description of the drawings in which:

The drawing illustrates a preferred form of circuit for a metal detector incorporatng the features of this invention.

As an example of one embodiment of this invention, there is shown a metal detector circuit including a first transistor 10 and its associated circuit forming a conventional Hartley oscillator such as shown, for example, on pages 174 and 175 of Technical Manual TM 11–690 of the Department of the Army of March 1959. The inductance 11 includes a search coil 12 used to hunt out and locate the metal deposits. The output of the first transistor 10, which is a field effect transistor, is coupled to a second transistor 13 through a capacitor 14. The second transistor 13 is a conventional resistance capacitance coupled amplifier and its output is coupled to a third transistor 15 through the capacitor 16. The third transistor is biased beyond cutoff so that only a signal of a strong level will be passed by it and a slight change in this level may change its output from zero to maximum thereby making it sensitive to slight changes in its input around a certain level.

The output of the third transistor 15 is coupled by capacitor 17 to the fourth transistor 18 which is biased similar to the third transistor 15. The output of the fourth transistor is measured by an indicating meter 19. Resistors 20 and 21 form a voltage divider so that the voltage between them is relatively low on the order of .4 volt while the supply voltage from the first battery 22 is 9 volts. The output of the fourth transistor 18 is filtered by the capacitor 23 so its output is varying DC current. The indicating meter 19 is hooked up to the fourth transistor 18 so that when there is no signal into the fourth transistor its reading will be maximum. Therefore, the higher the reading on the indicating meter 19 the weaker the signal will be into the meter.

The output of the fourth transistor 18 is also coupled to the variable contact 24 on the potentiometer 25 through the resistor 27 so that the voltage on the variable contact 24 of the potentiometer 25 will be the sum of the plus voltage from the resistor 27 and the minus voltage of resistor 28. This sum will always be minus because of the selection of the resistor values of resistors 27 and 28. This summed voltage is applied to the gate of the first transistor 10 through resistors 29 and 30. This system forms a negative feedback system to keep the output of the first transistor the same. Capacitors 31 and 32 act to keep the phase proper so as to prevent modulation oscillation, the resistor 29 being of the order of 140 megohms and capacitor 32*a* being of the order of 2 $\mu$f. and very low leakage. Therefore, for short times the amplitude of oscillation of the first transistor 10 can change substantially before the negative feedback can effect it.

The Q of the tuned circuit is adjusted so that its amplitude of oscillation is low and a slight reduction of its Q will cause its amplitude of oscillation to decrease. It therefore becomes very sensitive to a lowering of its Q. When a piece of metal is brought within proximity of its coil 12 it will reduce its Q and its output will be reduced. This change will be indicated by the meter 19 by increasing readings.

There is thus provided a metal detector which tends to stay in tune because of the negative feedback, but because its feedback is delayed, can still detect metal.

If the circuit should get out of tune, a push button stwitch 33 can be closed and there is no delay in feedback and it will quickly become tuned only by the closing of the push button switch 33. Also because the amount of feedback is so great the whole circuit can be tuned when first turned on by only pressing a push button switch. Potentiometer 25 is used to trim the circuit so that when the push button switch 33 is closed the indicating meter 19 can be adjusted to read anywhere on its dial. Potentiometer 34 is used to control the sensitivity of the circuit. The voltage on the variable contact 24 of potentiometer 25 is chosen so that an increase negatively of the voltage will cause the gain of the first transistor 10 to reduce. A second battery 35 has its positive terminal connected to ground and its negative terminal to the outer terminal of the resistor 28.

While the apparatus herein disclosed and described constitutes a preferred form of the invention, it is also to be understood that the apparatus is capable of mechanical alteration without departing from the spirit of the invention and that such mechanical arrangement and commercial adaptation as fall within the scope of the appendent claim are intended to be included herein.

Having thus fully set forth and described this invention what is claimed and desired to be obtained by United States Letters Patent is:

1. A metal detecting circuit comprising: a parallel resonant tank circuit the inductance of which includes the inductance of a search coil inductively coupled thereto; a field effect transistor connected to said resonant tank to form a Hartley oscillator; said resonant circuit having a low Q sufficient to sustain oscillations but sensitive to further lowering of said Q for substantially lowering the amplitude of oscillations; a meter for indicating the amplitude of said oscillations; means connecting the output of said Hartley oscillator to said meter through an amplifier; means defining a negative feedback path from the input to said meter to said high input impedance amplifying device, said feedback path including an RC delay network for delaying negative feeback signals; and switch means for shunting a portion of said RC network to eliminate the delay caused thereby to said feedback signals.

References Cited

UNITED STATES PATENTS

| | | | |
|---|---|---|---|
| 2,807,720 | 9/1957 | Charles. | |

| | | | |
|---|---|---|---|
| 2,907,017 | 9/1959 | Cowen. | |
| 2,919,413 | 12/1959 | Charles | 324—3 XR |
| 3,201,774 | 8/1965 | Uemura | 324—3 XR |
| 3,202,909 | 8/1965 | Stewart | 324—3 |
| 3,329,906 | 7/1967 | Bringert | 331—65 |

GERARD R. STRECKER, *Primary Examiner.*

U.S. Cl. X.R.

324—41; 331—65, 109, 117